(12) United States Patent
Marhasin (10) Patent No.: US 7,504,075 B2
(45) Date of Patent: Mar. 17, 2009

(54) ULTRASONIC REACTOR AND PROCESS FOR ULTRASONIC TREATMENT OF MATERIALS

(75) Inventor: Evgeny Marhasin, Migdal Ha'Emek (IL)

(73) Assignee: Nano-Size Ltd., Migdal Ha'emek (IL)

( * ) Notice: Subject to any disclaimer, the term of this patent is extended or adjusted under 35 U.S.C. 154(b) by 653 days.

(21) Appl. No.: 10/515,483

(22) PCT Filed: May 29, 2003

(86) PCT No.: PCT/IL03/00450

§ 371 (c)(1),
(2), (4) Date: Jul. 22, 2005

(87) PCT Pub. No.: WO03/101609

PCT Pub. Date: Dec. 11, 2003

(65) Prior Publication Data

US 2005/0260106 A1    Nov. 24, 2005

(30) Foreign Application Priority Data

May 30, 2002    (IL) .................................. 149932

(51) Int. Cl.
*B06B 1/00* (2006.01)
(52) U.S. Cl. .................. 422/128; 422/20; 310/321; 310/322; 310/334
(58) Field of Classification Search .................. 422/20, 422/128; 310/321, 322, 334
See application file for complete search history.

(56) References Cited

U.S. PATENT DOCUMENTS

| 4,071,225 A | 1/1978 | Holl |
| 4,131,238 A | 12/1978 | Tarpley, Jr. |
| 4,158,368 A | 6/1979 | Clark |
| 4,308,474 A | 12/1981 | Savage et al. |
| 4,369,100 A | 1/1983 | Sawyer |
| 4,378,258 A | 3/1983 | Clark et al. |
| 4,433,916 A | 2/1984 | Hall |
| 4,556,467 A | 12/1985 | Kuhn et al. |
| 4,763,030 A | 8/1988 | Clark et al. |
| 4,808,084 A | 2/1989 | Tsubouchi et al. |

(Continued)

FOREIGN PATENT DOCUMENTS

DE    880 516    6/1953

(Continued)

OTHER PUBLICATIONS

English Abstract of EP 0 090 932 dated Oct. 12, 1983.

(Continued)

*Primary Examiner*—Sean E Conley
(74) *Attorney, Agent, or Firm*—Ladas & Parry LLP (57) ABSTRACT

An ultrasound reactor (30) having a reactor body (1), a reactor tube (9) disposed within the reactor body and a magnetostrictor transducer (11) comprising at least one annular element (28*a-d*) concentric with, and mounted to an external wall of said tube and a process for ultrasonic treatment of a reaction material are disclosed. The transducer is mounted on the reactor tube in such a way so as to transmit ultrasound radiation to the interior of the tube and to induce an upwardly flowing cavitation stream whose longitudinal axis substantially coincides with a longitudinal axis of said tube, causing physical changes to the reaction material.

30 Claims, 5 Drawing Sheets

U.S. PATENT DOCUMENTS

| | | | |
|---|---|---|---|
| 5,384,508 | A | 1/1995 | Vaxelaire |
| 5,520,717 | A | 5/1996 | Miller et al. |
| 5,658,534 | A | 8/1997 | Desborough et al. |
| 5,660,773 | A | 8/1997 | Stangle et al. |
| 6,035,897 | A | 3/2000 | Kozyuk |
| 6,066,328 | A | 5/2000 | Ribier et al. |
| 6,079,508 | A | 6/2000 | Caza |
| 6,126,097 | A | 10/2000 | Chen et al. |
| 6,137,209 | A | 10/2000 | Nilsson et al. |
| 6,168,762 | B1 | 1/2001 | Reichman et al. |
| 6,203,768 | B1 | 3/2001 | McCormick et al. |
| 2004/0256213 | A1 | 12/2004 | Marhasin et al. |

FOREIGN PATENT DOCUMENTS

| | | |
|---|---|---|
| DE | 890 728 | 9/1953 |
| DE | 909 637 | 4/1954 |
| EP | 0 090 932 | 10/1983 |
| WO | 97/02088 | 1/1997 |
| WO | 98/22277 | 5/1998 |
| WO | 98/49671 | 11/1998 |
| WO | 01/48181 | 7/2001 |
| WO | 01/83102 | 11/2001 |
| WO | 03/012800 | 2/2003 |

OTHER PUBLICATIONS

Suslick K.S. "Sonochemistry" *Science* (1990) vol. 247, pp. 1439-1445.

Trentler, T., et al. Sonochemical Synthesis of Naocrystalline Molybdenum Disilicide ($MoSi_2$) *Materials Science and Engineering A204* (1995) pp. 193-196.

Suslick, K., et al. "Sonochemistry and Sonocatalysis of Metal Carbonyls" *American Chemical Society* (1983) vol. 105, No. 18, pp. 5781-5785.

"Ultrasonic-Mini-Desintegrator DG-30" *Telsonic Co.*, Products Bulletin.

Martin, P.D., et al. "Reactor Design for Sonochemical Engineering" *Institution of Chemical Engineers* (1992) vol. 70, Part A, pp. 296-303.

ULTRASONIC REACTOR AND PROCESS FOR ULTRASONIC TREATMENT OF MATERIALS

FIELD OF THE INVENTION

The present invention relates to the field of ultrasonic treatment of materials. More particularly, the invention relates to a reactor which comprises a reactor tube and at least one annular magnetostrictor transducer element mounted on the external wall of the tube, such that the transducer is capable of transmitting ultrasound radiation to the interior of the tube and inducing a vertically flowing cavitation stream whose vertical axis substantially coincides with the longitudinal axis of the tube.

BACKGROUND OF THE INVENTION

Ultrasounds have many applications in present-day technology in physical and chemical processes. Some general references are:

1) K. S. Suslick, Sonochemistry, Science, 247, pp. 1439-1445 (23 Mar. 1990);
2) W. E. Buhro et al., Material Science Eng., A204, pp. 193-196 (1995);
3) K. S. Suslick et al., J. Am. Chem. Soc., 105, pp. 5781-5785 (1983);
4) Telesonic Co., Products Bulletin.

There are several types of ultrasonic reactors. One of them is the loop reactor, described e.g. in D. Martin and A. D. Ward, Reactor Design for Sonochemical Engineering, Trans IChemE, Vol. 17, Part A, May 1992, 29, 3. Inside this reactor, a liquid which is to be subjected to ultrasound treatment, is caused to flow in a closed loop formed by a vessel provided with a stirrer and by a conduit in which the ultrasound generator is housed.

Also, several transducers may be placed around an elongated enclosure, as in U.S. Pat. No. 5,658,534 and U.S. Pat. No. 6,079,508.

This invention relates to a type of reactor in which the reaction occurs in a localized space filled with a material that is generally a liquid phase, which may contain solid particles. By the term "reaction" is meant herein whatever phenomenon is caused or facilitated by the ultrasound radiation, viz. not necessarily a chemical phenomenon, but a physical one or a combination of the two, as well. A reactor of this type is coupled to a transducer, wherein an oscillating, generally alternating, magnetic field is generated by an oscillating, generally alternating, current—hereinafter called "the exciting current." The reactor contains a material to be treated by ultrasound, which will be called hereinafter "reaction material". The reaction material generally comprises a liquid phase and fills the process chamber.

The transducers of ultrasound devices can be of various types. Most common transducers are piezo-electric ones. Therein, the generator of the ultrasound typically consists of a piezo-electric element, often of the sandwich type, coupled with a horn having a generally circular emitting face. Piezo-electric transducers, however, have a maximum power of about 2 kW and a low maximum oscillation amplitude dictated by the fragility of piezo-electric elements, which tend to break under prolonged working load. They are also not reliable compared to magnetostrictive transducers, to be described hereinafter, because their amplitude drifts with operation, causes breakdowns and lower energy output and has to be manually corrected. Similar properties are also possessed by electrostrictive materials polarized by high electrostatic fields.

Another type of transducer is that based on the use of a magnetostrictive material, viz. a material that changes dimensions when placed in a magnetic field, and conversely, changes the magnetic field within and around it when stressed. When a magnetostrictive material is subjected to a variable magnetic field, the material will change dimensions with the same frequency with which the magnetic field changes.

Magnetostrictive materials, to be quite suitable, must present a sufficiently large magnetic stricture at the temperature at which the ultrasonic reactor is intended to be used. To achieve this, proposals have been made to use special magnetostrictive materials, for example, alloys containing rare earth materials: see, e.g., U.S. Pat. Nos. 4,308,474, 4,378,258 and 4,763,030. Such alloys are expensive, and, in spite of their better elastic properties, they suffer major drawbacks, one of them being that they will break if subjected to relatively high power, e.g. 5 Kw, and at lower levels of power they do not transduce enough electromagnetic energy to acoustic energy.

A magnetostrictive transducer must comprise a magnetostrictive element, e.g. a rod or another elongated element, located in a space in which an oscillating magnetic field is produced. In its simplest form, such a transducer would comprise a nucleus of magnetostrictive elements and a coil disposed around said element and connected to a generator of oscillating electric current. However, different forms of transducers can be devised to satisfy particular requirements: for instance, U.S. Pat. No. 4,158,368 discloses a toroidal-shaped core of magnetic metal, about which a coil is wound, which toroid defines with its ends an air gap in which a magnetostrictive rod is located.

The magnetostrictive transducer transduces the electromagnetic power it receives into ultrasonic power, which it transmits to an irradiating device—the wave guide or horn. It will be said hereinafter that the horn irradiates the ultrasound into a process chamber, but no limitation is intended by said expression, which is used only for the sake of brevity. Generally, the horns of the prior art have a slim frusto-conical shape or a stepped or exponential shape. In every case, they concentrate the ultrasonic vibrations and irradiate them from their tip, which is generally circular and anyway of reduced dimensions. The ultrasonic waves have therefore a high intensity only at the tip of the horn and spread out from it in a conical configuration, so that they reach only a part of the process chamber and at any point of said chamber their intensity is reduced, generally proportionally to the square of the distance from the horn tip. At their region of maximum intensity various phenomena occur, including heating, cavitation, evaporation, and so on, which absorb and waste a large portion of the ultrasound energy, resulting in a limited efficiency, which is generally in the order of 20-30%. Additionally, some desired phenomena that are produced by the high energy density at the tip of the horn may become reversed at a distance from said tip: for instance, if it is desired to fragment solid particles, contained in a liquid phase, into smaller ones, such smaller particles may be produced at the tip of the horn, but then migrate through the liquid phase and coalesce to some extent at a distance from said tip, so that the particles finally obtained are not as small as desired.

Material treatment of various materials with high intensity ultrasound has recently achieved a significant role in different industries. Ultrasound treatment has been applied to particle dispersing, emulsification, mixing and dissolving of various materials. Other types of processes suitable with ultrasonic radiation are disclosed in U.S. Pat. Nos. 4,131,238, 4,556,467, 5,520,717, 6,035,897, 6,066,328 and 6,168,762.

U.S. Pat. No. 4,071,225 discloses an apparatus for material treatment by the application of ultrasonic longitudinal pressure oscillations, consisting of an enclosure for material to be treated therein having an interior with two closely-spaced walls at least one of which is made to oscillate at ultrasonic frequencies. The spacing between the walls is such that the pressure oscillations produced at the oscillating wall are reflected by the other wall before they are attenuated to a negligible value, thus producing waves with periodically changing frequencies and resulting in thorough dispersion of fine particles in the liquid vehicle. Intense cavitation appears near the reactor walls of this apparatus and therefore interferes with the transfer of ultrasonic energy to the working volume.

U.S. Pat. No. 6,079,508 discloses an ultrasonic processor, which comprises a hollow elongated member with a plurality of transducers fixed to the exterior of the elongated member and a control means for regulating the frequency of the ultrasonic waves produced by the transducers. Although the processor focuses ultrasonic energy onto the center of the reactor, so that cavitation disperses from the center to the periphery of the reactor, thereby protecting the reactor from cavitation damage, the processor suffers from several disadvantages.

Firstly, the transducers are preferably piezoelectric elements which are produced from a ceramic material, and these types of transducers tend to exhibit flexural failure upon exposure to high oscillating amplitudes. Piezoelectric transducers do not facilitate automatic control of the resonance frequency. In piezoelectric transducers a direct relationship between current and magnetic field is non-existent, and therefore the resonance frequency cannot be automatically adjusted in response to changes in the system during operation. Therefore if the piezoelectric material cannot withstand the oscillation amplitude at which it is vibrating, resulting in cracking or fracture due to the stress acting thereon, the transducers are liable to fail without warning.

Secondly, the affixing of the transducers by bonding or by soldering induces a high intensity of ultrasonic energy at those surfaces on the reactor to which the transducers are affixed. This high intensity results in cavitation to those surfaces on the reactor surface, causing pitting to the irradiator and shortening its life. Thirdly, piezoelectric transducers require a high level of operating voltage due to their relatively high resistivity so that a predetermined amount of current may pass therethrough.

Co-pending International Publication No. WO 03/012800 by the Applicant discloses an ultrasound device for the production of material having dimensions in the order of nanometers, comprising a magnetostrictive transducer and a hollow horn which transmits ultrasonic radiation in a substantially uniform manner throughout a reaction chamber. In response to ultrasonic vibrations, the walls of the horn oscillate elastically and produce alternate compression and decompression. It is desired to provide a reactor in which the irradiator does not oscillate elastically. It is also desired to provide a reactor for effecting other processes, in addition to the production of nano-products.

It is a purpose of this invention, therefore, to provide an ultrasound device that is free from the drawbacks of the prior art ultrasound devices.

It is another purpose of the invention to provide such an ultrasound device which has a higher power than the prior art devices.

It is another purpose of the invention to provide an ultrasound device wherein the transducer is of a new design, namely, a magnetostrictive annular ring.

It is an additional purpose of this invention to provide an ultrasonic device in which intense cavitation does not appear near the reactor walls.

It is a further purpose of the invention to provide such an ultrasound device comprising a transducer that is durable and has a high oscillation amplitude, up to 45 microns.

It is a further purpose of the invention to provide such an ultrasound device comprising a transducer that is not of the piezoelectric type.

It is a still further purpose of this invention to provide a reactor for emulsification, particle dispersion and deagglomeration.

It is a still further purpose of this invention to provide a reactor that is capable of effecting speedy ultra-fine grinding.

It is a still further purpose of this invention to provide means for the acceleration of reactions.

Other objects and advantages of the invention will become apparent as the description proceeds.

SUMMARY OF THE INVENTION

An ultrasound reactor of the present invention comprises a reactor body, a reactor tube disposed within said reactor body, a magnetostrictor transducer comprising at least one annular element concentric with, and mounted to an external wall of said tube, and a cylindrical absorber mountable on the outer periphery of each transducer element.

As referred to herein, an "absorber" is an element that partially absorbs ultrasonic radiation, while the remaining energy that is not absorbed is reflected.

Said transducer is mounted on said tube in such a way so as to transmit ultrasound radiation to the interior of said tube and to induce an upwardly flowing cavitation stream whose longitudinal axis substantially coincides with a longitudinal axis of said tube.

The diameter of said tube is proportional to the wavelength of said transmitted ultrasonic radiation. A selected tube diameter is suitable for inducing waves of said ultrasonic radiation to propagate at a resonance frequency such that the efficiency of the reactor without an absorber ranges from 30 to 40% and the efficiency of the reactor ranges from 60 to 80% when said absorber is mounted on each transducer element.

The diameter of the cavitation stream ranges from 5-30 mm, and preferably from 5-10 mm. The diameter of the cavitation stream is preferably essentially uniform throughout the length of the transducer.

Each magnetostrictor element preferably comprises a plurality of plates made from a ferromagnetic material. In one aspect, the ferromagnetic material is permendur. In one aspect, each magnetostrictor element preferably comprises 150-300 plates, each of which has a thickness of approximately 0.2 mm. Each plate has an inner diameter ranging between 25-200 mm.

In another aspect, the total length of the magnetostrictor transducer is approximately 40 cm.

An outer wall of the reactor tube and an inner wall of each magnetostrictor element are preferably burnished, such that the outer diameter of the reactor tube has a dimension of approximately 40 microns greater than the inner diameter of each magnetostrictor element.

Each magnetostrictor element is mounted on the reactor tube following a hot adjustment.

The absorber is preferably made of a suitable material such that an ultrasonic wave outwardly radiating from the transducer will be partially absorbed in said absorber and partially inwardly reflected into the reactor tube. As a result, a reflected inwardly directed wave has the same frequency and amplitude as an outwardly radiating wave. In one aspect, the material of the absorber is partially absorbent (x %) and partially reflective (100−x %) and may be selected from the group of rubber and polyurethane.

The reactor is capable of irradiating a power range of 1 to 8 kW, and preferably at least 2.5 kW, of ultrasonic energy into the reactor tube. The frequency range of the ultrasonic energy preferably ranges from 8 to 25 kHz.

Excessive heat generated by the transducer is removed by a cooling liquid flowing between the transducer and reactor body.

The reactor preferably further comprises a stirrer, said stirrer capable of operating at a pressure of up to 5 kg/cm² within liquid introduced into the reactor tube. An impeller of the stirrer is disposed within the reactor tube, preferably at a location radially outwards of the cavitation stream. The impeller is preferably provided with two vertical blades and two blades inclined at 45 degrees with respect to the vertical blades.

The present invention also comprises a processor for material processing in the aforementioned ultrasonic reactor.

The processor preferably comprises a generator for generating waves of alternating current at variable ultrasonic frequencies ranging from 8 to 25 kHz, the frequency and intensity of which is controllable in response to process conditions. The generator preferably comprises means for generating and maintaining electromagnetic energy at a predetermined resonance frequency essentially throughout the duration of a process.

In one aspect, the processor preferably further comprises a pump for delivering treated liquid into the reactor tube at a pressure of up to approximately 8 atmospheres.

In another aspect, the processor preferably further comprises a tank for storing cooling liquid and means for controlling the temperature of the cooling liquid.

The present invention also involves a process for ultrasonic treatment of a reaction material, comprising the following steps:
 a) Providing an ultrasound reactor comprising a reactor body, a reactor tube having a longitudinal axis disposed within said reactor body, a magnetostrictor transducer comprising at least one annular element concentric with, and mounted to an external wall of said tube, and a cylindrical absorber mountable on the outer periphery of each transducer element;
 b) Introducing a reaction material comprising at least one liquid into said reactor tube;
 c) Transmitting waves of electromagnetic energy at ultrasonic frequencies to said transducer;
 d) Allowing said transducer to transduce the electromagnetic energy into ultrasonic energy at a resonance frequency and to irradiate waves of said ultrasonic energy the diameter of said tube being proportional to the wavelength of said waves of ultrasonic energy;
 e) Allowing inwardly directed ultrasonic waves to converge at approximately the longitudinal axis of said reactor tube such that the efficiency of the reactor without an absorber ranges from 30 to 40% and the efficiency of the reactor ranges from 60 to 80% an absorber is mounted on each transducer element, thereby inducing an upwardly flowing cavitation stream within said reaction material, the longitudinal axis of said cavitation stream substantially coinciding with the longitudinal axis of said reactor tube;
 f) Allowing said cavitation stream to cause physical changes to said reaction material; and
 g) Removing ultrasonically treated reaction material from said reactor tube.

Inwardly directed ultrasonic waves radiating from each transducer element propagate through a wall of the reactor tube and preferably induce a zone of low intensity cavitation outwardly disposed relative to the cavitation stream, said zone being defined by a boundary, located radially inwards from said wall.

The diameter of the cavitation stream is essentially uniform and continuous throughout the length of the transducer. The length of the cavitation stream is approximately equal to the length of the transducer.

The cavitation stream is preferably fountain-like, due to high-intensity implosions that are induced thereat.

The process preferably further comprises the step of allowing an ultrasonic wave radiating outwardly from the transducer to be partially inwardly reflected by a cylindrical absorber mounted on each element. In one aspect, an outwardly radiating ultrasonic wave is absorbed and reflected by the absorber. In another aspect, a reflected inwardly directed wave has the same frequency and amplitude as an outwardly radiating wave.

The process preferably further comprises the step of introducing a cooling liquid within the reactor body, external to the reactor tube, wherein said cooling liquid flows within spacing between each adjacent element.

The process is selected from the group of ultra-fine grinding, agitation, dispersion, emulsification and deagglomeration.

Ultra-fine grinding is preferably effected with particles of a hardness of up to 9 in the Mohs Scale. The particles are for example selected from the group of alumina, silver, silica, and ceria.

In one process, alumina particles having a size ranging from 1-6 microns are reduced in size to a range of 0.1-1.5 microns in 1 hour.

DETAILED DESCRIPTION OF PREFERRED EMBODIMENTS

Figure 1:
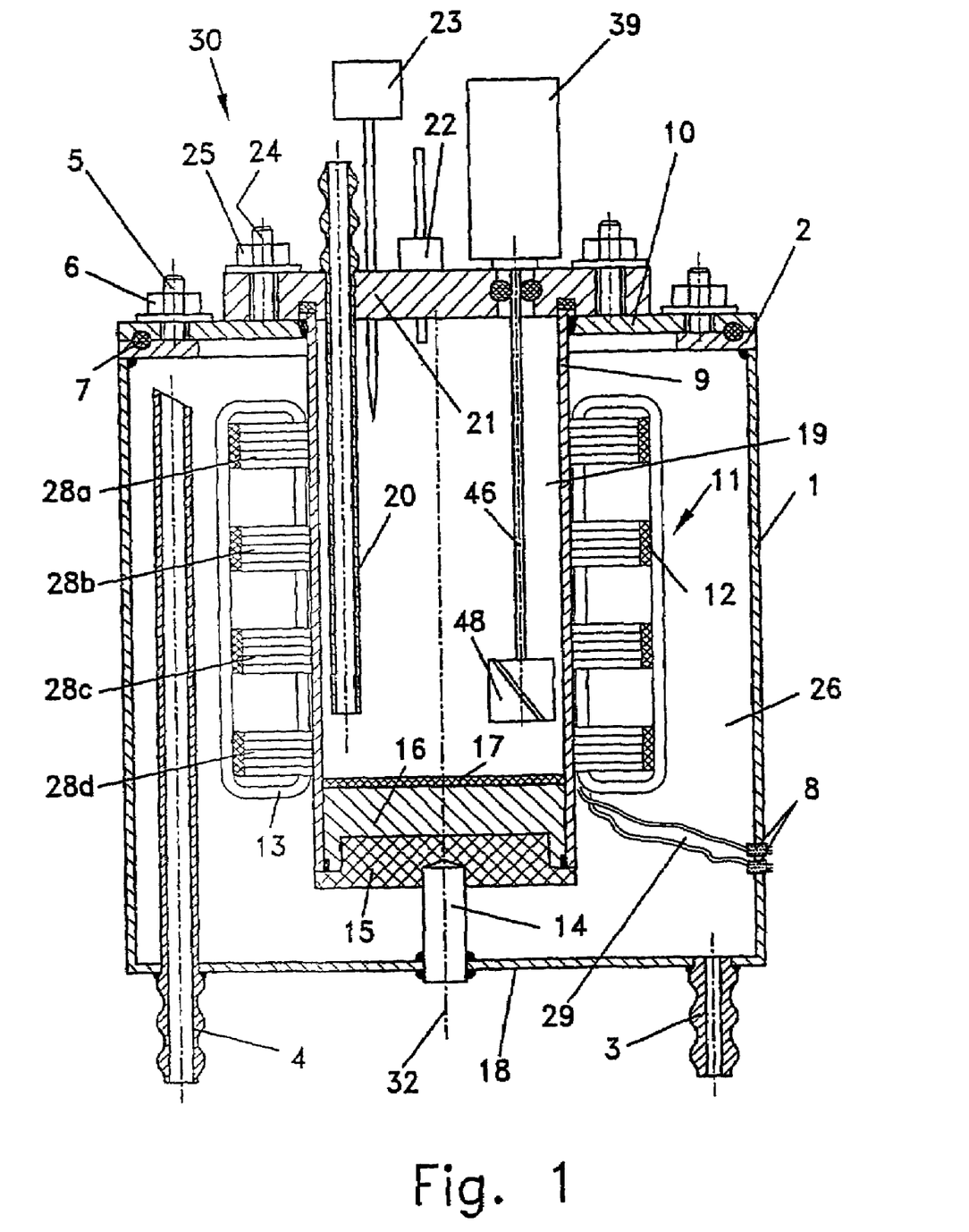
FIG. 1 is a cross sectional view of an ultrasonic reactor, in accordance with the present invention.

FIG. 1 illustrates a reactor according to the present invention, which is generally designated as 30. Reactor 30 comprises body 1, e.g. stainless steel of 1.5 mm thickness, into which reactor tube 9, e.g. made of ASTM 306 L stainless steel, is insertable. The interior of reactor tube 9 defines process chamber 19, and the volume external to reactor tube 9 and internal to body 1 constitutes cooling chamber 26. An annular focused transducer which is designated by numeral 11 is mounted onto the external wall of reactor tube 9 so as to be symmetric with respect to the axis of reactor tube 9.

Reactor bottom 18 is provided with openings for cooling liquid inlet pipe 3 and cooling liquid outlet pipe 4, wherein the diameter of outlet pipe 4 is greater than inlet pipe 3 to thereby produce a pressure differential which facilitates the circulation of the cooling liquid. A centrally located opening is formed in bottom 18 for the insertion therethrough of fitting 14, which is welded thereto, on which cylinder 15 is mounted. Cylinder 15 functions as an electrical insulator for tube 9, and is made of e.g. rigid plastic reinforced by glass fibers. Cylinder cover 16, which is made of a massive material, e.g. stainless steel, in order to withstand the high pressures that are induced during material processing, is welded to the lower inner wall of reactor tube 9. Disc 17, which is mounted on cylinder cover 16, is made of acoustic rubber and has an outer diameter essentially equal to the inner diameter of reactor tube 9, to prevent the flow of processed material within the clearance between tube 9 and cover 16. Body 1 is formed with hermetically sealed cable conduit 8 for coil wires 29.

Annular bottom flange 2, the inner diameter of which is slightly larger than the outer diameter of transducer 11, is welded to the top of body 1. Top flange 10 is connected to bottom flange 2, e.g. by a plurality of cotter pins 5 and corresponding nuts 6, and is sealed by means of rubber packing 7. Top flange 10 is also annular, and the diameter of its opening is equal to the outer diameter of reactor tube 9. Cover 21 is connected to top flange 10, e.g. by a plurality of cotter pins 24 and corresponding nuts 25. Reactor cover 21 is formed with several openings to allow for the communication with process chamber 19 of feed tube 20, secondary tube 22, thermocouple 23, a manometer (not shown) and stirrer 39.

A suspension or any other liquid under pressure is injected into process chamber 19, via feed tube 20, which is welded to cover 21. The ultrasonically treated liquid may be automatically discharged from process chamber 19 by means of tube 22, as a result of the pressure differential that results from the difference in diameters between feed tube 20 and the narrower secondary tube 22. Alternatively, the ultrasonically treated liquid may be discharged semi-automatically, viz. by the depressing of control buttons. Accordingly, secondary tube 22 is closed as liquid is introduced into process chamber 19 by feed tube 20. Following the ultrasonic treatment and the ensuing reaction, a pressurized fluid, e.g. air at 5 atmospheres, is injected into tube 22 and entrains the ultrasonically treated liquid through tube 20.

Transducer 11 is cylindrical and is advantageously divided into four elements 28a-d to allow for, on one hand efficient ultrasonic transmission into process chamber 19 and on the other hand increased heat transfer to the surrounding cooling liquid to prevent any transducer overheating or failure. It will be appreciated that the transducer may be comprised of one or more elements.

The reactor efficiency is defined as the percentage of ultrasonic energy that is utilized in the process chamber, i.e. the ratio between the ultrasonic energy generated by transducer 11 and the ultrasonic energy influx into process chamber 19. In order to maximize reactor efficiency, the energy influx into the process chamber needs to be maximized and the energy loss from the transducers needs to be minimized. Energy influx is maximized by focusing inwardly radiating ultrasonic energy onto longitudinal axis 32 of reactor tube 9. The reactor efficiency is further increased by the addition of cylindrical absorber 12, which is mounted on the outer periphery of each transducer element 28. The efficiency of the reactor ranges from 60-80%, and ranges from 30-40% when absorbers are not employed.

Absorber 12 is made of a partially absorbent material, e.g. rubber or polyurethane, which results in absorbance and reflectance of incident ultrasonic radiation, to reduce energy loss to cooling chamber 26. Consequently, an outwardly radiating ultrasonic wave, that is, in the direction of cooling chamber 26, will be partially absorbed by absorber 12 and then reflected into process chamber 19. A reflected inwardly directed wave has the same frequency and amplitude as an outwardly radiating wave. Since the absorbent material causes heat dissipation of the absorbed ultrasonic energy, the transducer is advantageously divided into a plurality of elements so that the top and bottom of each absorber 12 may be cooled by the surrounding cooling water. Absorber 12 also adds to the longevity of the reactor 30 by preventing pitting at the cooling water jacket, which would have resulted from cavitation induced by an outwardly directed wave.

Figure 2:
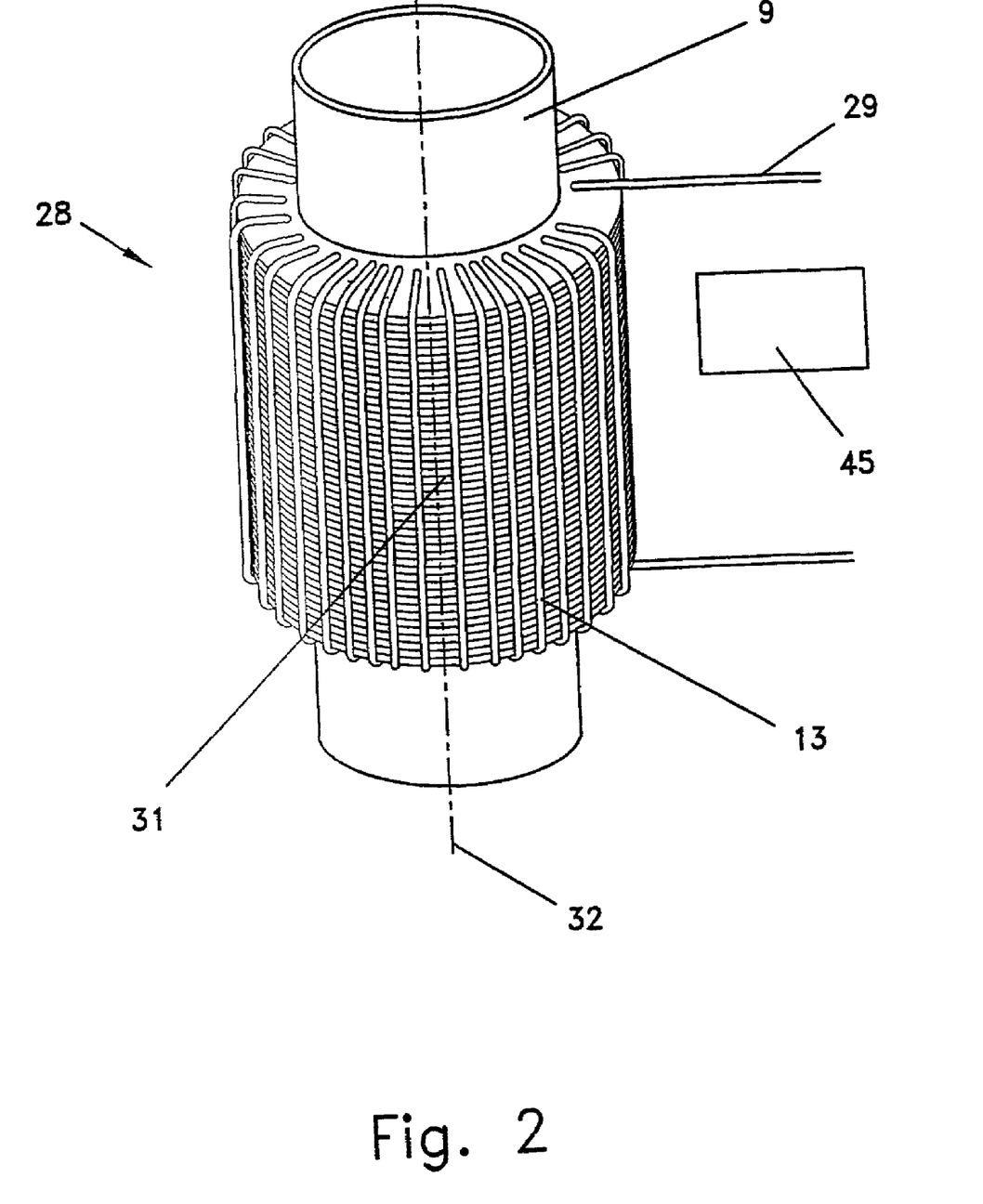
FIG. 2 is a perspective view of a magnetostrictor element which is mounted on a reactor tube, in accordance with the present invention.

FIG. 2 illustrates an element 28 of transducer 11, which is mounted on the outer wall of reactor tube 9. Each magnetostrictor element 28 is preferably a magnetostrictor and comprises a plurality of annular permendur plates 31, although any ferromagnetic alloy is suitable as well for the production of the transducer. Each element 28 comprises, by example, of 150-300 plates, with each plate having a thickness of approximately 0.2 mm, such that the total length of four transducer elements is by example approximately 40 cm. Each plate 31 has an inner diameter ranging from 25-200 mm. Each plate 31 is formed with a plurality of apertures for the insertion of electrical wire 29 therethrough so that a coil 13 may be formed by the wire and wound about magnetostrictor element 28.

Each plate 31 is cut with a general tolerance, including its thickness and outer diameter, of 0.05 mm, so that all plates of element 28 will be aligned. In order to generate a homogeneous magnetic field in the reactor, the magnetic properties of each plate, including hysteresis, induction, magnetic flux density and magnetic field strength, need to be substantially identical. Plates with similar magnetic properties are placed adjacent one to another, and then the plates undergo thermal treatment in a vacuum furnace so that all of the plates will have substantially identical magnetic properties. The plates are held under pressure in order to retain their dimensions during the thermal treatment. Following the thermal treatment, the plates are bonded together, e.g. with ceramic paste or any other suitable bonding material, and baked in a vacuum furnace at a vacuum of approximately $10^{-5}$ torr in order to prevent oxide contamination thereof. The plates are baked at a temperature no greater than 280° C. so as not to weaken the bonding. This process is then repeated for the other magnetostrictor elements.

The outer wall of reactor tube 9 and the inner wall of all of the magnetostrictor elements are burnished, such that the outer diameter of reactor tube 9 has a dimension of 40 microns greater than the inner diameter of each magnetostrictor element 28. A so-called hot adjustment is then performed, whereby the magnetostrictor elements are heated to a temperature of approximately 280° C. and reactor tube 9 is cooled to a temperature of approximately −75° C., such as by application of liquid nitrogen, so that the magnetostrictor elements may be mounted by pressure on the reactor tube with the necessary adjustment tension. The tension imposed on the reactor tube enables the latter to undergo elastic deformation, and thereby transfers substantially all of ultrasonic energy transmitted by the transducer. It will be appreciated that with the aforementioned manufacture and assembly process, ultrasonic energy may be transmitted to reactor tube 9 and focused along longitudinal axis 32 thereof with a minimal amount of losses due to the tight fit between the magnetostrictor elements and the reactor tube. As a result, uniform cavitation may be achieved along longitudinal axis 32.

Following the mounting of the magnetostrictor elements, coil 13 is wound about transducer 11, such that conducting wire 29 passes through each of the vertically stacked plates 31 before being wound for an additional loop, and then is directed through cable conduit 8 (FIG. 1). Top flange 10 is then connected to bottom flange 2, after which cover 21 is connected to top flange 10.

Operationally, current, which is produced by generator 45 and passes through coil 13, generates a magnetic field parallel to the plane of each permendur plate 31. The magnetic field in turn induces each transducer element 28 to vibrate, and as a result transducer 11 transduces the electromagnetic power it receives into ultrasonic power. Ultrasonic waves are transmitted radially inwards, some of which after being reflected by absorber 12 (FIG. 1), through the wall of reactor tube 9.

Figure 3:
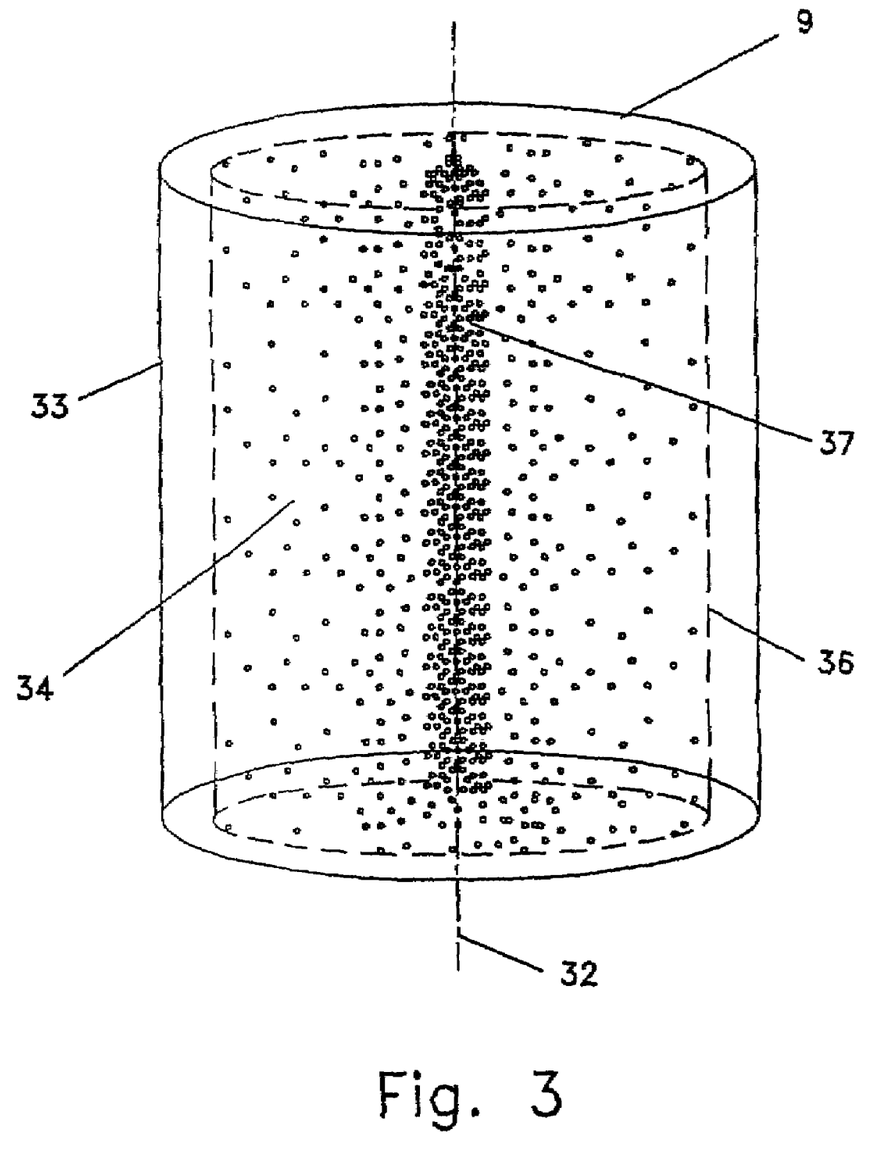
FIG. 3 is a simulation of a focused cavitation stream, on which the present invention is based.

Referring now to FIG. 3, which is a simulation of a phenomenon on which the present invention is based, inwardly directed ultrasonic waves radiating from each permendur plate 31 (FIG. 2) propagate through wall 33 of reactor tube 9 and induce zone 34 of low intensity cavitation within the liquid medium that has been introduced into the reactor tube. Zone 34 of low intensity cavitation is defined by boundary 36, located radially inwards from wall 33. Cavitation is inhibited between wall 33 and boundary 36 due to the hydrostatic pressure that results from inwardly radiating compression waves which compress the liquid medium from wall 33 to boundary 36. Since cavitation is not induced at wall 33, erosion of the reactor tube wall is substantially non-existent.

As the inwardly directed ultrasonic waves continue to propagate, they converge at axis 32 and induce a localized compression wave, due to the high intensity energy influx thereat. The localized compression wave results in a focal vaporous transient cavitation region concentric to axis 32, in which bubbles smaller than the resonant size are created. These bubbles are filled with vapor and grow a's the pressure falls through the rarefaction half-cycle of the ultrasonic wave and then collapse rapidly. Consequently, fine and uniform upwardly flowing cavitation stream 37, having a similarity to a fountain due to the rapidly rising high-intensity implosions is induced along axis 32 and is capable of causing physical changes to the liquid medium. Cavitation stream 37 has a diameter of approximately 5-30mm, and preferably 5-10 mm, depending upon the frequency of the ultrasonic waves and the diameter of reactor tube 9.

The length of cavitation stream 37 is substantially equal to the length of transducer 11 (FIG. 1). Since ultrasonic waves inwardly radiate from each plate 31 (FIG. 2) and cause high-intensity cavitation at the center of the corresponding plate, coincident with axis 32, the rapidly collapsing bubbles mix along the length of the transducer and result in a continuous cavitation stream. When transducer 11 is comprised of separate elements 28 as depicted in FIG. 1, the spacing between adjacent elements is sufficient to provide cooling of the elements while retaining continuity of cavitation stream 37. It has been surprisingly found that even though the diameter of low intensity cavitation zone 34 is reduced along the spacing between adjacent elements 28 due to the lack of plates 31, cavitation stream 37 continues to be continuous with a uniform diameter along its entire length because of the high momentum of the rapidly collapsing bubbles.

In a preferred design, the diameter of reactor tube 9 is inversely proportional to the ultrasonic frequency. The wavelength $\lambda$ of the ultrasonic radiation is given by $\lambda=v/\gamma$, wherein $\gamma$ is the frequency and $v$ is the velocity of the ultrasound propagation in the material of which reactor tube is made. For example, a process chamber having a volume of 5 L is suitable for an ultrasonic frequency range of 8-12 kHz, and a process chamber having a volume of 1 L is suitable for an ultrasonic frequency range of 18-22 kHz.

The intensity I of the ultrasound radiation corresponding to an energy W, assumed to be uniformly distributed, is I=W/S, wherein S is the area from which the ultrasound is irradiated. In ideal cases, the intensity I can be calculated from the formula $I=v\rho\gamma^2A^2$, wherein $v$ is the ultrasound velocity in the environment, $\rho$ is the density of the environment, $\gamma$ is the ultrasound frequency and A the ultrasound amplitude. In the reactor of the present invention, the intensity of the energy influx into the process chamber ranges from 2.6-6.6 W/cm$^2$ and the intensity per volume of the energy influx into the process chamber ranges from 0.7-1.8 W/cm$^3$.

In order to maximize the energy influx into the process chamber, the intensity and amplitude of the ultrasonic radiation should preferably be as large as possible. The present invention is capable of operating at a power level ranging from 1-8 kW, and preferably greater than 2.5 kW, which is irradiated into the process chamber, although the maximum power level should be limited to 5 kW to ensure structural integrity of the transducer.

Prior art devices are not capable of providing an influx of 5 kW into a corresponding reactor, and therefore are not capable of achieving speedy ultra-fine grinding of individual particles. The reactor of the present invention is capable of achieving the ultra-fine grinding of a single particle having a hardness of up to 9 in the Mohs Scale, as well as agitation, dispersion, emulsification and deagglomeration, i.e. separation of agglomerated particles.

Figure 4:
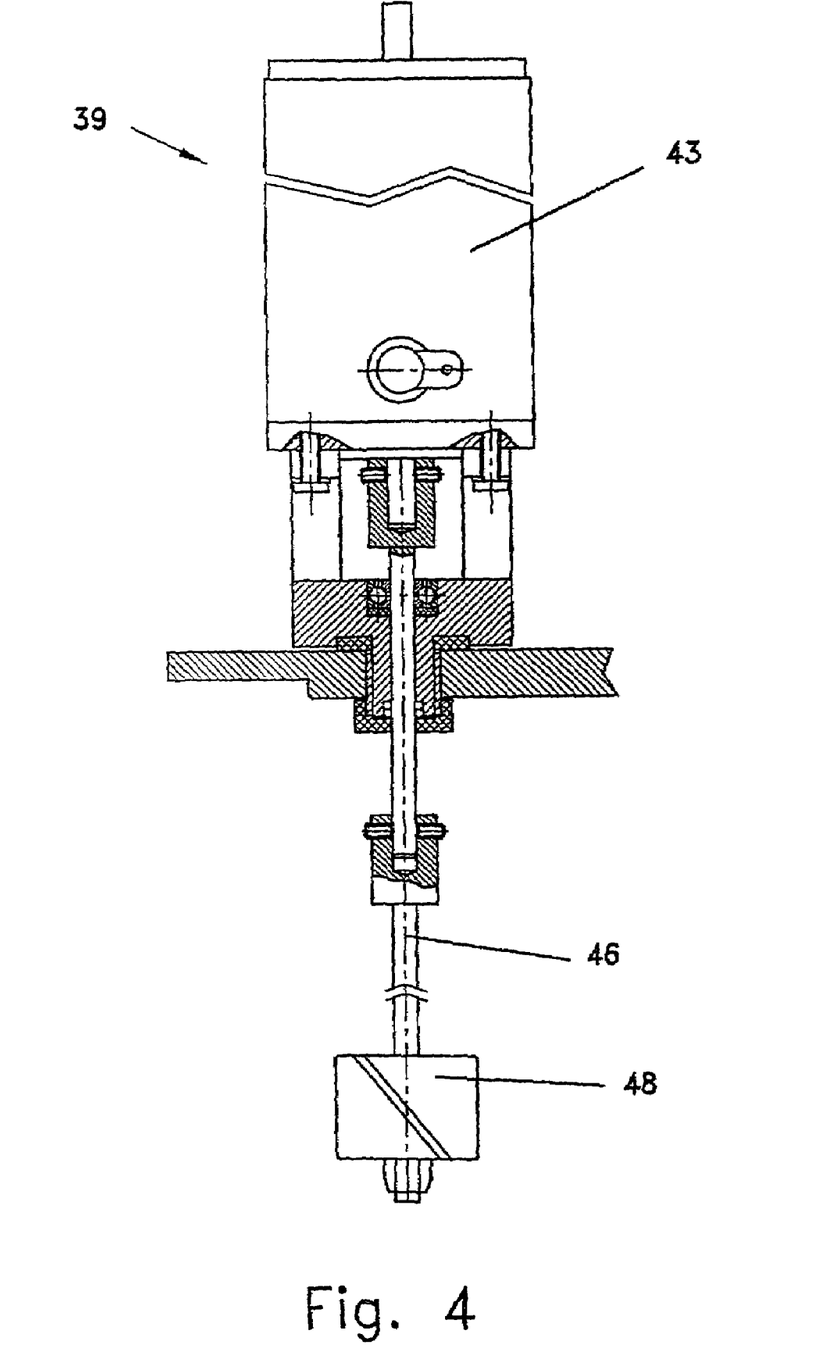
FIG. 4 is a cross sectional view of a stirrer.

FIG. 4 illustrates stirrer 39. At times the ultrasonic energy generated by transducer 11 is not sufficient for satisfactorily suspending the powder particles in the process chamber. Stirrer 39 is used to prevent sedimentation, and is capable of operating at a pressure of up to 5 kg/cm$^2$ within process chamber 19. The stirrer is disposed radially outward from axis 32, within low intensity cavitation zone 34 (FIG. 3), and ameliorates dispersion of relatively heavily suspended particles.

Stirrer 39 comprises motor 43, drive means for imparting torque to shaft 46, and impeller 48. Shaft 46 is made, by example, of Ti-4V-6A alloy. Impeller 48 is made from a non-corrosive material such as polypropylene, and is provided with two vertical blades and two blades inclined at 45 degrees with respect to shaft 46. This configuration of blades produces a turbulent stream of suspension particles and directs the flow from the top to bottom of process chamber 19. Motor 43, by example, is a 24V direct current motor that is capable of generating 200 W at a rotational speed of 2000 rpm.

Figure 5:
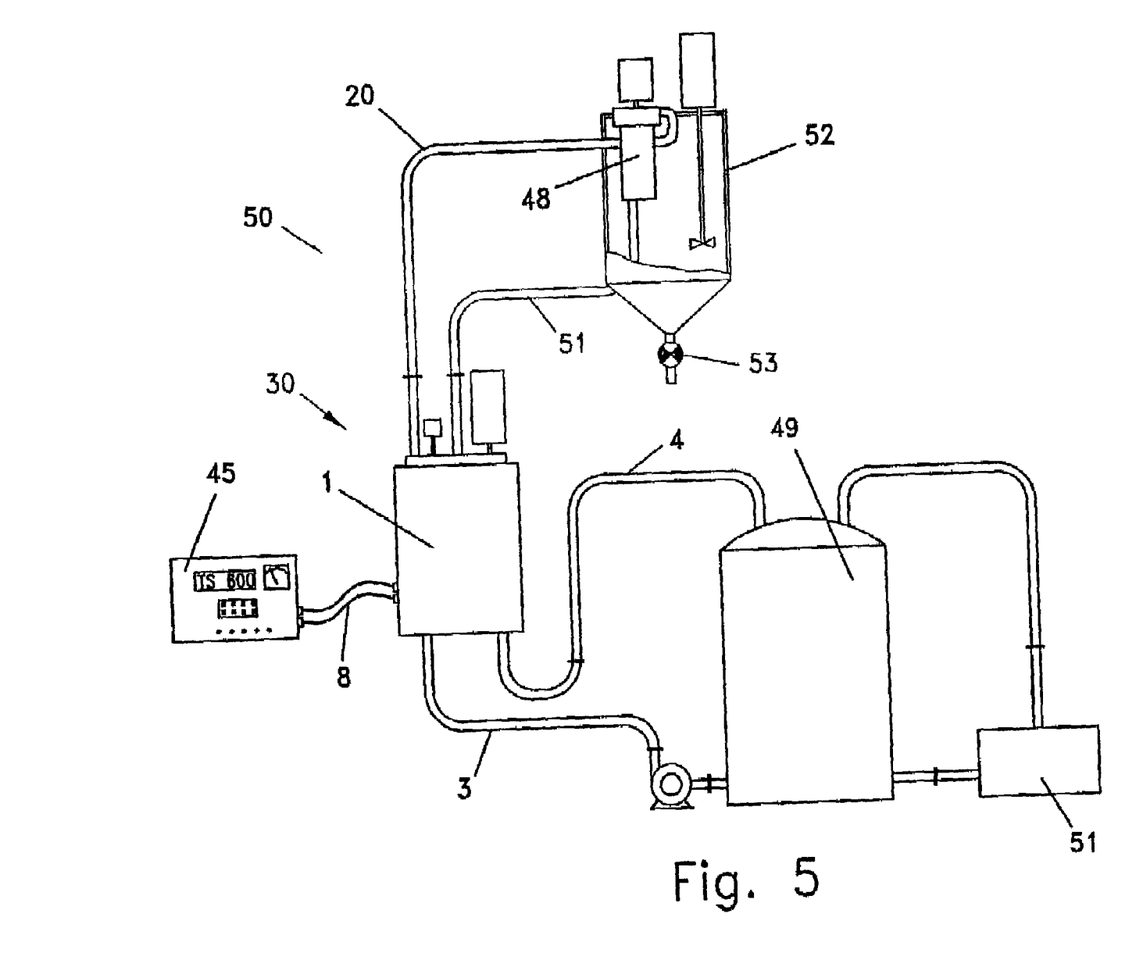
FIG. 5 is a schematic diagram of a processor used in accordance with the present invention.

FIG. 5 schematically illustrates a continuously feeding processor, generally indicated by 50, for effecting several processes with the use of reactor 30, according to the present invention. Ultrasonic generator 45 transmits waves of alternating current at ultrasonic frequencies, e.g. ranging from 8 to 25 kHz, the frequency and intensity of which can be set and controlled in response to process conditions, to the magnetostrictor elements by means of a cable passing through conduit 8. After an allowable range of frequency is programmed, ultrasonic generator 45 is capable of generating an initial frequency of ultrasonic energy and of regulating the generated energy in order to achieve a predetermined resonance frequency. The generator is capable of maintaining the resonance frequency throughout the remaining processing time.

Labyrinth pump 48 pumps liquid suspension under pressure, of up to 8 atmospheres, the flow rate and pressure of which can be regulated by pump 48 or by a capillary tube (not shown), depending on the characteristics of the suspension or the required process duration, through feed tube 20 into reactor 30 to undergo ultrasonic treatment within its process chamber. Ultrasonically treated liquid, which is withdrawn from reactor 30 by discharge tube 51, may be released from storage vessel 52 for sampling and further processing by opening valve 53. Valve 53 also allows for the injection of liquid into storage vessel 52 during the next processing run. Cooling liquid, the temperature of which is set and controlled by means of thermostat 51, is retained in tank 49, and is introduced through inlet pipe 3 into the cooling chamber. The cooling liquid is discharged from the cooling chamber via outlet pipe 4.

Processor 50 is suitable for producing ultra-fine powder. For example, alumina particles ranging from 1-6 microns may be reduced in size to a range of 0.1-1.5 microns in 1 hour with implementation of the present invention. Similarly the present invention may be utilized for particle dispersing, emulsification, agitating and dissolving various materials.

EXAMPLE 1

Ultra-Fine Grinding 85 g of silver particles are mixed with 780 ml of deionized water. The suspension is fed into a 1 L chamber, and is treated for a period of 3 hours at a pressure of 3.5 atmospheres with an influx of ultrasonic energy having a power of 3 kW, wherein the temperature within the process chamber is 44° C.

The following is the particle size distribution, in microns, wherein the subscript refers to the percentage of total particles having a size equal to or less than the listed value:

|  | $d_{10}$ | $d_{50}$ | $d_{90}$ |
|---|---|---|---|
| Initial | 7.9 | 26.1 | 54.3 |
| Final | 0.09 | 0.14 | 0.2 |

EXAMPLE 2

Ultra-Fine Grinding 1000 g of silica particles for use in glazed coatings are added to 4600 ml of deionized water. The suspension is fed into a 5 L chamber, and is treated for a period of 90 minutes at a pressure of 3.2 atmospheres with an influx of ultrasonic energy having a power of 4.6 kW, wherein the temperature within the process chamber is 42° C.

The following is the particle size distribution in microns, wherein the subscript refers to the percentage of total particles having a size equal to or less than the listed value:

|  | $d_{10}$ | $d_{50}$ | $d_{90}$ |
|---|---|---|---|
| Initial | 0.8 | 1.9 | 5.9 |
| Final | 0.09 | 0.6 | 1.5 |

EXAMPLE 3

Ultra-Fine Grinding 600 g of ceria particles (CeO$_2$) needed for Chemical Mechanical Planarization (CMP) are added to 4600 ml of deionized water. The suspension is fed into a 4.5 L chamber, and is treated for a period of 60 minutes at a pressure of 3.0 atmospheres with an influx of ultrasonic energy having a power of 4.6 kW, wherein the temperature within the process chamber is 32° C.

The following is the particle size distribution in microns, wherein the subscript refers to the percentage of total particles having a size equal to or less than the listed value:

|  | $d_{10}$ | $d_{50}$ | $d_{90}$ |
|---|---|---|---|
| Initial | 0.6 | 3.24 | 8.93 |
| Final | 0.15 | 0.24 | 0.65 |

EXAMPLE 4

Ultra-Fine Grinding 1000 g of silica particles, a cristalolite mineral, are added to 4600 ml of deionized water. The suspension is fed into a 4.5 L chamber, and is treated for a period of 90 minutes at a pressure of 4.0 atmospheres with an influx of ultrasonic energy having a power of 4.6 kW, wherein the temperature within the process chamber is 45° C.

The following is the particle size distribution in microns, wherein the subscript refers to the percentage of total particles having a size equal to or less than the listed value:

|  | $d_{10}$ | $d_{50}$ | $d_{90}$ |
|---|---|---|---|
| Initial | 1.2 | 4.25 | 12.84 |
| Final | 0.32 | 0.78 | 2.26 |

EXAMPLE 5

Homogeneous Dispersion 42 g of polytetrafluoroethane (PTFE) are vigorously mixed together with 600 ml of distilled water within an intermediate container to thereby prepare a first suspension, which is then fed into a 5 L process chamber. A second suspension is prepared from 273 g of active carbon, 29 g of metal oxide and 1400 ml of distilled water. The second suspension is then fed to the process chamber, in addition to the first suspension, to thereby prepare a slurry. The slurry is treated for a period of 30 minutes with an influx of ultrasonic energy having a power of 3 kW, wherein the temperature within the process chamber is ambient temperature. The resulting dispersion has a degree of homogeneity of 98%.

EXAMPLE 6

Emulsion 2.5 L of deionized water and 2.5 g of polyoxyethylene sorbitan (a surface active material of an organic acid type) are fed to a process chamber of 5 L. 2.5 L of vegetable oil are then gradually added for a period of 10 minutes to the process chamber and vigorously mixed with a stirrer until achieving a pressure of 2 atmospheres, to thereby produce a suspension. The suspension is treated for a period of 10 minutes with an influx of ultrasonic energy having a power of 5 kW, wherein the temperature within the process chamber is 40° C. A stable emulsion of 50% vegetable oil resulted.

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. Ultrasound reactor comprising:
    a) a reactor body;
    b) a reactor tube disposed within said reactor body; and
    c) a magnetostrictor transducer comprising at least one annular element positioned coaxial with an internal wall of said tube, and mounted on the external wall of said tube,
   wherein said transducer mounted on said tube in such a way so as to transmit ultrasonic radiation to the interior of said tube and to induce an upwardly flowing cavitation stream whose longitudinal axis substantially coincides with a longitudinal axis of said tube,
   wherein the diameter of said tube is proportional to the wavelength of said transmitted ultrasonic radiation,
   characterized in that the reactor further comprises
    d) a cylindrical absorber mounted on the outer periphery of said annular element,
   wherein a selected tube diameter is suitable for inducing waves of said ultrasonic radiation to propagate at a resonance frequency such that the efficiency of the reactor without an absorber ranges fro 30 to 40% and the efficiency of the reactor ranges from 60 to 80% when said absorber is mounted on each said annular element.

2. Ultrasonic reactor of claim 1, wherein the diameter of the cavitation stream ranges from 5 to 30 mm.

3. Ultrasonic reactor of claim 2, wherein the diameter of the cavitation stream is essentially uniform throughout the length of the transducer.

4. Ultrasonic reactor of claim 2, wherein the length of the cavitation stream is approximately equal to the length of the transducer.

5. Ultrasonic reactor of claim 1, wherein said annular element comprises a plurality of plates made from a ferromagnetic material.

6. Ultrasonic reactor of claim 5, wherein the ferromagnetic material is permendur.

7. Ultrasonic reactor of claim 5, wherein said annular element comprises 150 to 300 plates.

8. Ultrasonic reactor of claim 5, wherein each plate has a thickness of approximately 0.2 mm.

9. Ultrasound reactor of claim 5, wherein each plate has an inner diameter ranging preferably from 25 to 20 mm.

10. Ultrasonic reactor of claim 1, wherein an outer wall of the reactor tube and the inner wall of each annular element are burnished, such that the outer diameter of the reactor rube has a dimension of approximately 40 microns greater than the inner diameter of said annular element.

11. Ultrasonic reactor of claim 10, wherein each magnetostrictor element is mounted on the reactor tube following a hot adjustment.

12. Ultrasonic reactor of claim 1, wherein the absorber is made of a suitable material such that an ultrasonic wave outwardly radiating from the transducer will be partially absorbed in said absorber and partially inwardly reflected into the reactor tube.

13. Ultrasonic reactor of claim 12, wherein a reflected inwardly directed wave has the same frequency and amplitude as an outwardly radiating wave.

14. Ultrasonic reactor of claim 12, wherein the material of the absorber is selected from the group of rubber and polyurethane.

15. Ultrasonic reactor of claim 1, wherein the power range of ultrasonic energy which is irradiated into the reactor tube is 1 to 8 kW.

16. Ultrasonic reactor of claim 1, wherein the frequency range of ultrasonic energy which is irradiated into the reactor tube is preferably from 8 to 25 kHz.

17. Ultrasonic reactor of claim 1, wherein excessive heat generated by the transducer is removed by a cooling liquid.

18. Ultrasonic reactor of claim 1, further comprising a stirrer.

19. Ultrasonic reactor of claim 18, wherein an impeller of the stirrer is disposed within the reactor tube, at a location radially outwards of the cavitation stream.

20. Ultrasound reactor of claim 19 wherein the impeller is provided with two vertical blades and two blades inclined at 45 degrees with respect to the vertical blades.

21. Process for ultrasonic treatment of a reaction material, comprising the following steps:
    a) Providing an ultrasound reactor comprising a reactor body, a reactor tube disposed within said reactor body, and a magnetostrictor transducer comprising at least one continuous annular element positioned coaxial with, an external wall of said tube and mounted on the external wall of said tube;
    b) Introducing a reaction material comprising at least one liquid into said reactor tube;
    c) Transmitting waves of electromagnetic energy at ultrasonic frequencies to said transducer;
    d) Allowing said transducer to transduce the electromagnetic energy into ultrasonic energy at a resonance frequency and to irradiate waves of said ultrasonic energy, the diameter of said tube being proportional to the wavelength of said waves of ultrasonic energy;
    e) Allowing inwardly directed ultrasonic waves to converge at approximately the longitudinal axis of said reactor tube, thereby inducing an upwardly flowing cavitation stream within said reaction material, the longitudinal axis of said cavitation stream substantially coinciding with the longitudinal axis of said reactor tube;
    f) Allowing said cavitation stream to cause physical changes to said reaction material; and
    g) Removing ultrasonically treated reaction material from said reactor tube, characterized by mounting a cylindrical absorber mountable on an outer periphery of said annular element, whereby the efficiency of the reactor without an absorber ranges from 30 to 40% and the efficiency of the reactor ranges from 60 to 80% when an absorber is mounted on said annular element.

22. Process of claim 21, wherein inwardly directed ultrasonic waves radiating from said annular element propagate through a wall of the reactor tube and induce a zone of low intensity cavitation outwardly disposed relative to the cavitation stream, said zone being defined by a boundary, located radially inwards from said wall.

23. Process of claim 21, wherein the diameter of the cavitation stream is essentially uniform and continuous throughout the length of the transducer.

24. Process of claim 21, wherein the length of the cavitation stream is approximately equal to the length of the transducer.

25. Process of claim 21, wherein the cavitation stream is fountain-like, due to high-intensity implosions that are induced thereat.

26. Process of claim 21, further comprising the step of introducing a cooling liquid within the reactor body, external to the reactor tube, wherein said cooling liquid flows within spacing between each adjacent element.

27. Process of claim 21, further comprising the step of allowing an ultrasonic wave radiating outwardly from the transducer to be partially inwardly reflected by a cylindrical absorber mounted on each element.

28. Process of claim 21, further comprising the step of stirring the reaction material.

29. Process of claim 21, wherein the process is selected from the group of ultra-fine grinding, agitation, dispersion, emulsification and deagglomeration.

30. Process of claim 29, wherein ultra-fine grinding is effected with particles of a hardness of up to 9 in the Mohs Scale.

* * * * *